United States Patent
Ono et al.

(10) Patent No.: US 6,593,595 B2
(45) Date of Patent: Jul. 15, 2003

(54) SEMICONDUCTOR LIGHT-EMITTING DEVICE AND METHOD FOR PRODUCING SAME

(75) Inventors: Tomoki Ono, Nara (JP); Shigetoshi Ito, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/075,760

(22) Filed: Feb. 12, 2002

(65) Prior Publication Data

US 2002/0158259 A1 Oct. 31, 2002

(30) Foreign Application Priority Data

Feb. 14, 2001 (JP) .......................................... 2001-037758

(51) Int. Cl.[7] ............................................... H01L 33/00
(52) U.S. Cl. ............................. 257/79; 257/79; 257/17
(58) Field of Search ............................ 257/79, 17, 25, 257/103, 94; 372/46, 45

(56) References Cited

U.S. PATENT DOCUMENTS 5,751,756 A * 5/1998 Takayama et al. ............. 372/46
6,072,817 A * 6/2000 Adachi et al. ................. 372/45
6,160,829 A * 12/2000 Sawano ......................... 372/45
6,191,431 B1 * 2/2001 Hoof et al. .................... 257/17

OTHER PUBLICATIONS

Appli Phy. letter Jan. 20, 1992 American Institute of Physics By T J de Lyon; JM woodall :Doping Concentration dependance of radiance and optical modulation bandwidth in Carbon Doped GaInP/GaAs light–emitting diodes grown by Gas source molecular beam ep.*

* cited by examiner

Primary Examiner—David Nelms
Assistant Examiner—Thinh Nguyen
(74) Attorney, Agent, or Firm—Morrison & Foerster LLP

(57) ABSTRACT

A semiconductor light-emitting device of the present invention includes: a substrate; a light-emitting layer provided above the substrate; and a saturable absorbing layer provided above the substrate, the saturable absorbing layer having characteristics in which saturation of light absorption occurs. The semiconductor light-emitting device has self-pulsation characteristics due to the saturable absorbing layer, and the semiconductor light-emitting device is characterized in that the saturable absorbing layer is doped with carbon.

7 Claims, 7 Drawing Sheets

SEMICONDUCTOR LIGHT-EMITTING DEVICE AND METHOD FOR PRODUCING SAME

This application claims priority to Japanese Patent Application Number 2001-037758 filed Feb. 14, 2001, the content of which is incorporated herein by reference in its entirety.

BACKGROUND OF THE INVENTION

1. Field of the Invention

The present invention relates to a semiconductor light-emitting device used for recording or reproduction of information on an optical disk which has self-pulsation characteristics for noise reduction, and to a method for producing such a device.

2. Description of the Related Art

As the storage capacity of optical disks has increased, there has arisen a need for a light source for optical disks having a narrower light-collecting diameter as compared to conventional light sources for optical disks so as to emit light having a wavelength of about 400 nm for recording information on an optical disk with high density. In an optical disk system, use of an inexpensive plastic material for a lens, a disk, etc., is considered for the purpose of reducing production costs of the optical system. However, a light absorption edge of such a plastic material is at a wavelength of up to about 390 nm. Accordingly, there is a necessity to study materials applicable to the light source for optical disks in order to achieve a shorter wavelength, and thus optical systems using such plastic material cannot be mass-produced. As a light source emitting light having such a short wavelength, conventionally, a semiconductor laser has been used. A representative material used for a semiconductor laser for emitting light having a wavelength of about 400 nm is a gallium nitride compound semiconductor.

A nitride semiconductor laser used in an optical disk system or the like has a structure which has self-pulsation characteristics in order to reduce the noise in optical feedback (hereinafter, also referred to as the "external optical feedback noise") from a reflective point on an optical disk, etc. In order to realize such a nitride semiconductor laser involving self-pulsation, a layer having saturable absorption characteristics (hereinafter, referred to as a "saturable absorbing layer") in which saturation of light absorption occurs is provided in a p-type cladding layer, etc., included in the nitride semiconductor laser.

Figure 7:
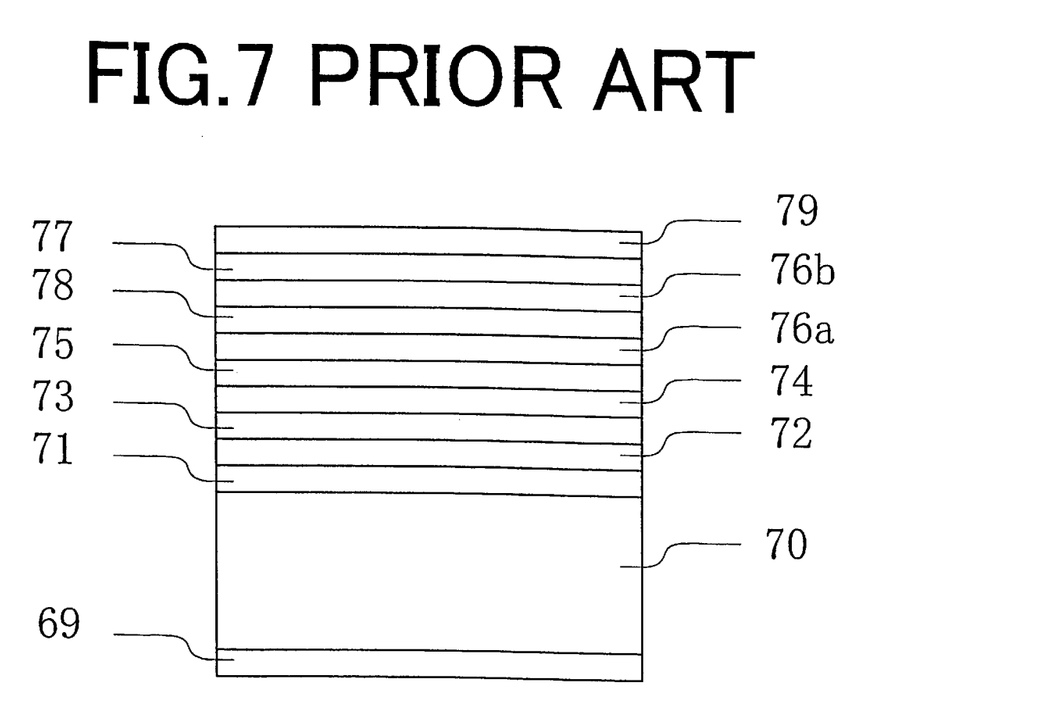
FIG. 7 is a cross-sectional view illustrating a structure of a conventional semiconductor laser.

FIG. 7 is a cross-sectional view of a representative structure of a low-noise semiconductor laser for optical disks as disclosed in Japanese Laid-Open Patent Publication No. 9-191160. This publication discloses a low-noise semiconductor laser capable of obtaining self-pulsation by using InGaN, which is a nitride semiconductor, and a mixed crystal of InN (indium nitride) and GaN (gallium nitride) for a saturable absorbing layer. As illustrated in FIG. 7, this low-noise semiconductor laser includes an n-type SiC substrate 70 on which an n-type AlN layer 71, an n-type AlGaN cladding layer 72, an n-type GaN light-guiding layer 73, an InGaN quantum well active layer 74, a p-type GaN light-guiding layer 75, a P-type AlGaN cladding layer 76*a*, an InGaN saturable absorbing layer 78, a p-type AlGaN cladding layer 76*b*, a p-type GaN contact layer 77, and a p-type electrode 79 are sequentially laminated. An n-type electrode 69 is provided below the n-type SIC substrate 70.

There is a possibility that the nitride semiconductor laser as disclosed in Japanese Laid-Open Patent Publication No. 9-191160 might not be preferably used for reproduction or recording/reproduction in an optical disk system, etc., since the range of output light wavelengths in which the nitride semiconductor laser can obtain self-pulsation is narrow. In such a nitride semiconductor laser including the saturable absorbing layer, satisfactory saturable absorption characteristics cannot be obtained unless carrier lifetime in the saturable absorbing layer including InGaN as a main component is short. In general, it is possible to shorten the carrier lifetime by doping the p-type InGaN saturable absorbing layer with Mg so as to enhance recombination of the carrier generated by light absorption. However, in practice, it is not easy to electrically activate almost an entire portion of the doped Mg provided in the InGaN saturable absorbing layer. Additionally, it is not easy to shorten apparent carrier lifetime since InGaN has a small carrier diffusion coefficient, whereby carriers generated in the saturable absorbing layer by light absorption are not easily diffused.

SUMMARY OF THE INVENTION

According to one aspect of the present invention, there is provided a semiconductor light-emitting device including a substrate; a light-emitting layer provided above the substrate; and a saturable absorbing layer provided above the substrate, the saturable absorbing layer having characteristics in which saturation of light absorption occurs, the semiconductor light-emitting device having self-pulsation characteristics due to the saturable absorbing layer and the semiconductor light-emitting device being characterized in that the saturable absorbing layer is doped with carbon.

In one embodiment of the invention, the saturable absorbing layer may be doped with a p-type dopant.

In one embodiment of the invention, the saturable absorbing layer may include a quantum well layer.

In one embodiment of the invention, the saturable absorbing layer may have a multiple quantum well structure including a plurality of quantum well layers and a plurality of barrier layers.

According to another aspect of the present invention, there is provided a method for producing a semiconductor light-emitting device, the method being characterized by comprising the steps of: forming a first nitride semiconductor layer on a first conductive nitride semiconductor substrate at a first growth temperature; sequentially forming above the first conductive nitride semiconductor layer a first conductive nitride semiconductor crack prevention layer at a second growth temperature differing from the first growth temperature, a first conductive nitride semiconductor cladding layer at the first growth temperature, and a first conductive nitride semiconductor guide layer at the first growth temperature; forming a first conductive nitride semiconductor active layer on the first conductive nitride semiconductor guide layer at a third growth temperature differing from the second growth temperature; sequentially forming above the first nitride semiconductor active layer a second conductive nitride semiconductor barrier layer and a second conductive nitride semiconductor guide layer at the first growth temperature; forming a saturable absorbing layer made of a nitride semiconductor on the second conductive nitride semiconductor guide layer at a fourth growth temperature differing from the third growth temperature; sequentially forming above the saturable absorbing layer made of a nitride semiconductor a second conductive nitride semiconductor cladding layer and a second conductive nitride semiconductor contact layer at the first growth temperature; and forming a ridge structure using a dry-etching treatment.

In one embodiment of the invention, the fourth growth temperature may be 700° C. or less.

Thus, the invention described herein makes possible the advantage of providing: a semiconductor light-emitting device which can obtain stable self-pulsation characteristics by shortening the lifetime of a carrier generated by light absorption in a saturable absorbing layer in order to reduce the external optical feedback noise; and a method for producing such a device.

This and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the drawings.
(Embodiment 1)

Self-pulsation is caused by the interaction in a saturable absorbing layer having saturable absorption characteristics and an active layer (a gain region) in which population inversion is caused by the carrier between a carrier injected into a semiconductor laser and photons. The first property required for the saturable absorbing layer is that an actual bandgap of the saturable absorbing layer is the same as that of the active layer or slightly narrower. In a nitride semiconductor laser, the range of bandgap difference between the saturable absorbing layer and the active layer is between about −0.15 eV and 0.02 eV. In order to properly control light absorption, it is desirable that the space between the active layer and the saturable absorbing layer is between about 0.02 μm and 1.5 μm. The second property required for the saturable absorbing layer is that, in order to cause effective self-pulsation, the carrier lifetime in the saturable absorbing layer is shorter than that in the active layer and saturation of light absorption readily occurs.

One of the most important properties of the nitride semiconductor laser is a carrier lifetime property in the saturable absorbing layer, which is the second property required for the saturable absorbing layer. The carrier lifetime in a nitride-based semiconductor is known to be short (several nanoseconds at minimum). In order to make a clear difference in carrier lifetime between the active layer and the saturate absorbing layer, it is conceivable, for example, that the saturable absorbing layer and the carrier recombination doped with a dopant of high concentration is effectively achieved by enhancing outward carrier diffusion through a light absorption region in the saturable absorbing layer, thereby shortening the apparent carrier lifetime.

In the conventional nitride semiconductor laser, as described above, the saturated adsorption layer is made of InGaN, and Mg or the like is generally used as a p-type dopant. However, it is not easy to dope the saturated absorbing layer with Mg of high concentration and electrically activate almost an entire portion of the doped Mg. In order to shorten the apparent lifetime of the carrier generated in the saturable absorbing layer by light absorption, it is essential for the saturable absorbing layer to have material characteristics such that the saturable absorbing layer has a sufficiently large diffusion coefficient so as to diffuse the generated carrier at a rate on the order of several nanoseconds through the light absorption region outwardly. However, in the saturable absorbing layer made of InGaN, etc., since the diffusion coefficient is small, such an effect of shortening the carrier lifetime cannot be attained by sufficiently diffusing the carrier generated in the saturable absorbing layer to recombine the carrier.

In the present invention, as a result of repeated studies on the above-described point, a semiconductor laser, which can obtain self-pulsation in a range from a low output level to a high output level, has been realized by doping the saturable absorbing layer with C (carbon). It has been found that defect density in the saturable absorbing layer is increased by doping the saturable absorbing layer with C. This increase in defect density contributes to enhancement of carrier recombination, so that the carrier lifetime is shortened. When the saturable absorbing layer made of InGaN is doped with C, the C becomes an impurity at a deep energy level. Accordingly, C is considered to hardly be in an activated state at this point. C has a small atomic radius, and thus results in a defect which deteriorates the crystallinity of InGaN when it is included in the saturable absorbing layer. As a result, the defect resulting from C relaxes the energy level and increases carrier recombination without radiation, thereby shortening the lifetime of the carrier generated by light absorption.

When the saturable absorbing layer made of InGaN is epitaxially grown at a temperature of 700° C. or less, C concentration in the saturable absorbing layer is increased, and the carrier recombination is enhanced by an increase in defect concentration accompanying the increase in the C concentration, thereby shortening the carrier lifetime. Thus, a semiconductor laser, which can obtain self-pulsation from a low output level to a high output level, can be realized. In this manner, by increasing the C concentration in the saturable absorbing layer, it is possible to enlarge an optical output range in which self-pulsation can be obtained.

Moreover, in the present invention, the semiconductor laser, which can obtain self-pulsation from a low output level to a high output level, can be realized by providing the nitride semiconductor laser with a saturable absorbing layer having a multiple quantum well structure, which includes a quantum well layer and a barrier layer. In this case, the quantum well layer is doped with C, but the barrier layer is not doped with C. Since the barrier layer is not doped with C, the defect concentration in the barrier layer is decreased and crystallinity of the barrier layers is improved, whereby satisfactory quantum effects are expected to be obtained due to the multiple quantum well. Thus, diffusion of the carrier generated by light absorption is facilitated.

It should be noted that in addition to C as a dopant, the saturable absorbing layer may be further doped with Mg or the like, which serves as an acceptor. By activating Mg or the like, radiational transition probability of the saturable absorbing layer can be improved.

Figure 1:
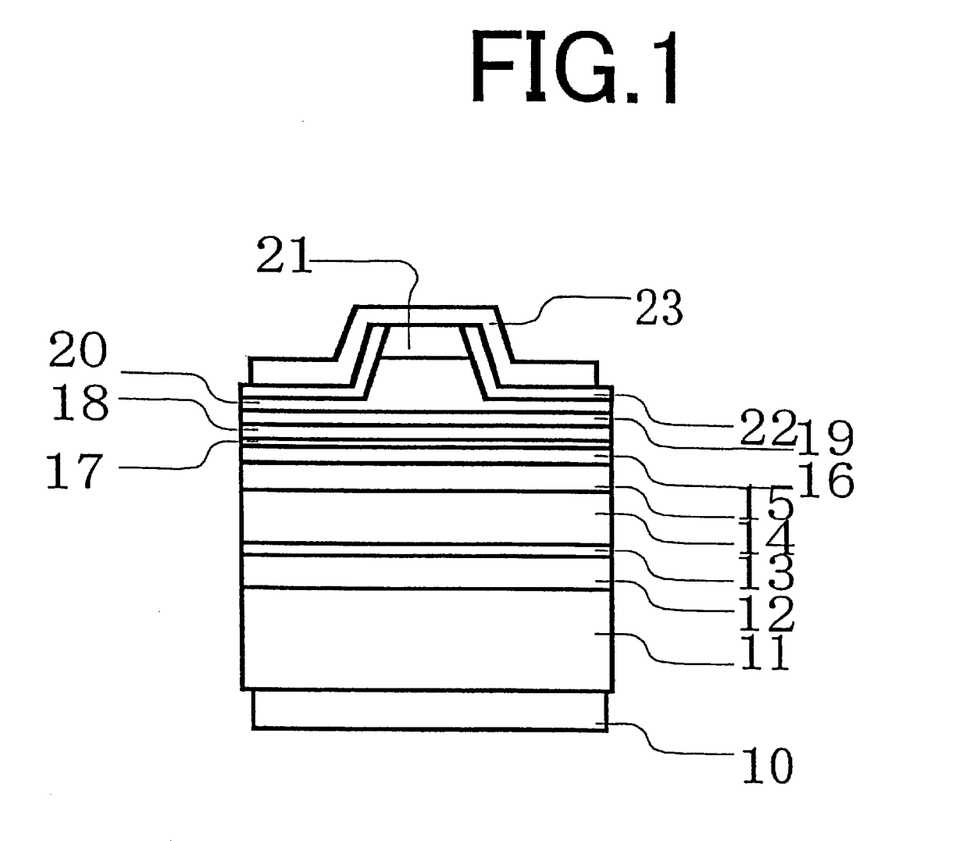
FIG. 1 is a cross-sectional view of a nitride semiconductor laser according to a first embodiment of the present invention.

FIG. 1 is a cross-sectional view of a nitride semiconductor laser according to a first embodiment of the present invention. This nitride semiconductor laser includes an n-type GaN substrate 11 on which an n-type GaN layer 12, an n-type InGaN crack prevention layer 13, an n-type AlGaN cladding layer 14, an n-type GaN guide layer 15, an n-type InGaN active layer 16, a p-type AlGaN barrier layer 17, a p-type GaN guide layer 18, a saturable absorbing layer 19 made of InGaN, and a p-type AlGaN cladding layer 20 are sequentially laminated. The p-type AlGaN cladding layer 20 has a ridge structure where a central portion of the p-type AlGaN cladding layer 20 along a width direction thereof projects perpendicular to a stripe direction (i.e., a direction perpendicular to the plane of FIG. 1). On the projected portion of the p-type AlGaN cladding layer 20, a p-type GaN contact layer 21 is laminated. An insulating layer 22 is provided on the p-type AlGaN cladding layer 20 and the p-type GaN contact layer 21 except a top surface of the p-type GaN contact layer 21. A p-type electrode 23 is provided on the insulating layer 22 and the top surface of the p-type GaN contact layer 21. An n-type electrode 10 is provided below the n-type GaN substrate 11.

The nitride semiconductor laser shown in FIG. 1 according to the first embodiment of the present invention, includes an index waveguide formed using the ridge structure described above, and the saturable absorbing layer 19 made of InGaN is a single quantum well layer.

A method for producing the nitride semiconductor laser shown in FIG. 1 will now be described. It should be noted that an epitaxial growth method described below is a method for growing a crystal film on a substrate, which includes, for example, a VPE (Vapor-Phase Epitaxy) method, a CVD (Chemical Vapor Deposition) method, an MOVPE (Metal-Organic Vapor-Phase Epitaxy) method, an MOCVD (Metal-Organic Chemical Vapor Deposition) method, a Halide-VPE (Halide Vapor-Phase Epitaxy) method, an MBE (Molecular Beam Epitaxy) method, an MOMBE (Metal-Organic Molecular Beam Epitaxy) method, a GSMBE (Gas Source Molecular Beam Epitaxy) method, or a CBE (Chemical Beam Epitaxial) method.

According to the method for producing the nitride semiconductor laser of the first embodiment of the present invention, firstly, the n-type GaN substrate 11 is formed. The n-type GaN substrate 11 is formed by providing a top surface of a GaN single crystal film having a thickness of about 500 $\mu$m with steps at intervals of several micrometers such that a difference in level among them is between about 10 nm and about 50 nm, and laminating onto the GaN single crystal film a GaN single crystal film having a thickness of about 4 $\mu$m using an epitaxial growth method. By forming the GaN single crystal film in this manner, a hysteresis such as penetrative transition can be eliminated from the resultant n-type Gan substrate 11. The resultant n-type GaN substrate 11 has a structure in which regions having high defect concentration and regions having very low defect concentration are cyclically repeated. The ridge structure of the nitride semiconductor laser of the present invention is provided in a region having very low defect concentration.

Next, the n-type GaN layer 12 is laminated on the n-type GaN substrate 11 using an epitaxial growth method. In this case, the n-type GaN substrate 11 is initially placed in an MOCVD device, and a low temperature GaN buffer layer is grown on the n-type GaN substrate 11 at a growth temperature of substantially 550° C. using $NH_3$ as a V-group material and TMGa (trimethylgallium) as a III-group material, such that the low temperature GaN buffer layer has a thickness of substantially 25 nm. Thereafter, the growth temperature is increased to about 1075° C., and $SiH_4$ is provided, together with the above two materials, on the low temperature GaN buffer layer, so that the n-type GaN layer 12 (Si high-impurity concentration: $1 \times 10^{18}/cm^3$) having a thickness of 3 $\mu$m is formed.

Next, the growth temperature is decreased to between about 700° C. and 800° C., and TMIn, which is a III-group material, is provided on the n-type GaN layer 12 so as to grow an n-type $In_{0.07}Ga_{0.93}N$ layer, thereby forming the n-type InGaN crack prevention layer 13 having a thickness of substantially 50 nm. Thereafter, the growth temperature is again increased to substantially 1075° C. and an n-type $Al_{0.1}Ga_{0.9}N$ layer (Si impurity concentration: $1 \times 10^{18}/cm^3$) is grown on the n-type InGaN crack prevention layer 13 using TMAl (trimethylaluminum), which is a III-group material, so that the n-type AlGaN cladding layer 14 having a thickness of substantially 0.95 $\mu$m is formed. Then, the n-type GaN guide layer 15 having a thickness of substantially 0.1 $\mu$m is formed on the n-type AlGaN cladding layer 14.

Next, the growth temperature is decreased to substantially 730° C., and an $In_{0.15}Ga_{0.85}N$ quantum well layer having a thickness of substantially 4 nm and an $In_{0.05}Ga_{0.95}N$ barrier layer having a thickness of substantially 6 nm are alternately formed on the n-type GaN guide layer 15 so as to grow an active layer having a multiple quantum well structure in which four barrier layers and three quantum well layers are cyclically laminated, thereby forming the n-type InGaN active layer 16. When forming the n-type InGaN active layer 16, during a period of time from the lamination of one barrier layer until the lamination of one quantum well layer, or during a period of time from the lamination of one quantum well layer until the lamination of one barrier layer, the crystal growth may be stopped for about one second to one hundred and eighty seconds. This operation improves the flatness of each layer included in the n-type InGaN active layer 16, thereby reducing a half-value width of light to be emitted.

Next, the growth temperature is again increased to substantially 1050° C. and a p-type $Al_{0.2}Ga_{0.8}N$ layer is grown on the n-type InGaN active layer 16, thereby forming the p-type AlGaN barrier layer 17 having a thickness of substantially 18 nm. Thereafter, the p-type GaN guide layer 18 having a thickness of substantially 0.1 $\mu$m is formed on the p-type AlGaN barrier layer 17. Both the p-type AlGaN barrier layer 17 and the p-type GaN guide layer 18 are doped with Mg as a p-type dopant at a concentration of $5 \times 10^{19}/cm^3$ to $2 \times 10^{20}/cm^3$.

Next, the growth temperature is decreased to substantially 650° C., and the saturable absorbing layer 19 made of InGaN is formed on the p-type GaN guide layer 18. The saturable absorbing layer 19 is doped with C as a dopant at a concentration of $1 \times 10^{17}/cm^3$ or more. In this case, the saturable absorbing layer 19 made of InGaN is doped with acetylene as a doping material of C. However, propane or the like may be used, and any material can be used as long as C is a dopant with which the saturable absorbing layer 19 is doped. Although the thickness of the saturable absorbing layer 19 is preferably substantially 3 nm in consideration of light absorption characteristics of InGaN, the thickness of the saturable absorbing layer 19 may be between about 1 nm and 10 nm, in view of results of a study on a mixed ratio, etc., of In conducted by the present inventors. Based on PL (photoluminescence) measurements of a wafer of the nitride semiconductor laser, a difference in a PL peak wavelength between light emitted by the n-type InGaN active layer 16 and light emitted by the saturable absorbing layer 19 is set so as to be within a range of between about −0.15 eV and 0.02 eV, so that actual bandgaps of the n-type InGaN active layer 16 and the saturable absorbing layer 19 are adjusted so as to be almost equivalent to each other.

Next, the growth temperature is again increased to substantially 1050° C. and a p-type $Al_{0.1}Ga_{0.9}N$ layer is grown on the saturable absorbing layer 19 made of InGaN, so that the p-type AlGaN cladding layer 20 having a thickness of substantially 0.5 $\mu$m is formed. Then, the p-type GaN contact layer 21 having a thickness of substantially 0.5 $\mu$m is formed on the p-type AlGaN cladding layer 20. Both the p-type AlGaN cladding layer 20 and the p-type GaN contact layer 21 are doped with Mg as a p-type dopant at concentration of $5 \times 10^{19}/cm^3$ to $2 \times 10^{20}/cm^3$. As described above, TMGa, TMAl, TMIn, $NH_3$, etc., are used as materials of elements included in respective layers of the nitride semiconductor laser, and $Cp_2Mg$ (biscyclopentadienyl magnesium), $SiH_4$, etc., are used as dopant materials with which the respective layers are doped.

After the formation of the p-type contact layer 21, the p-type AlGaN cladding layer 20 and the p-type GaN contact layer 21 are removed by dry etching such that their central portions along the width direction are left unremoved so as to form a ridge structure. Thereafter, the p-type AlGaN cladding layer 20 and the p-type GaN contact layer 21 are coated with the insulating film 22 such that only the top surface of the p-type GaN contact layer 21 is exposed. Then, the p-type electrode (Pd/Mo/Au) 23 is formed over the exposed top surface of the p-type GaN contact layer 21 and the top surface of the insulating film 22. The p-type electrode 23 electrically communicates with the top surface of the p-type GaN contact layer 21.

Then, a bottom surface of the n-type GaN substrate 11 is polished or etched so as to remove a portion of the n-type GaN substrate 11, thereby adjusting the thickness of the wafer so as to be as thin as between about 100 $\mu$m and 150 $\mu$m. This operation allows the wafer to be readily divided into individual semiconductor laser chips in a subsequent step. Particularly, in the case where a mirror is formed on a facet of the semiconductor laser during the subsequent division step, it is desirable that the thickness of the wafer is adjusted so as to be as thin as between about 80 $\mu$m and 120 $\mu$m. In the first embodiment of the present invention, although the thickness of the wafer is adjusted so as to be about 100 $\mu$m using a grinder and a polisher, only the polisher may be used for such adjustments. A bottom surface of the wafer is flat since it is polished using the polisher.

After the bottom surface of the n-type GaN substrate 11 is polished, a thin metal film is deposited thereon so as to form the n-type electrode 10 having a laminated structure of Hf/Al/Mo/Au. A vacuum deposition method is suitable for a method for forming such a thin metal film while controlling its thickness, and this method is used in the first embodiment of the present invention. However, the n-type electrode 10 may be formed using any other method, such as ion plating or sputtering. After the formation of the metal film, an annealing treatment is performed on each of the p-type electrode 23 and the n-type electrode 10 at a temperature of substantially 500° C. so as to form ohmic electrodes having satisfactory conductivity.

The wafer of the nitride semiconductor laser produced in the above-described manner is divided into semiconductor components (chips) by the following method. Firstly, scribe lines are made on a top surface of the wafer using a diamond point. The wafer is divided along the scribe lines by applying appropriate force thereto. It should be noted that the scribe lines may be made on a bottom surface of the wafer. Examples of other methods used for the wafer division include: a dicing method which uses a wire saw or a thin-plate blade to scratch or sever the wafer; a laser scribing method which irradiates and heats a wafer with a laser beam using an excimer laser, etc., and then rapidly cools the irradiated portion of the wafer so as to crack the irradiated portion and thereby make scribe lines; and a laser ablation method which irradiates a portion of a wafer with a laser beam of high energy density so as to evaporate the irradiated portion, thereby making grooves in the wafer. Using any of these methods, wafer division can be successfully performed.

Moreover, in the nitride semiconductor laser according to the first embodiment of the present invention, two facets of the semiconductor laser component are asymmetrically coated by forming a reflection coating having reflectance of 50% or lower on one of the two facets and forming a reflection coating having reflectance of 80% or more on the other facet. This allows a stable fundamental transverse mode to be achieved even when the semiconductor laser component is operated at a high output power of 30 mW or more.

Next, the nitride semiconductor laser chip is mounted on a heat sink, such as a stem, using die-bonding, thereby producing a nitride semiconductor laser device. The nitride semiconductor laser chip is firmly attached to the heat sink by junkup which joins the n-type electrode 10 to the heat sink.

Characteristics of the nitride semiconductor laser produced in this manner have been examined by the present inventors. The examination results are described as follows. A resonator length of the nitride semiconductor laser is substantially 500 $\mu$m, and a stripe width thereof is substantially 2 $\mu$m. When the temperature is 25° C., this nitride semiconductor laser continuously oscillates at a threshold current of 35 mA, which is a starting point of the laser oscillation. In this case, a wavelength is 405±5 nm. From observation of a far field pattern, it is appreciated that there are no ripples in the far field pattern, and concentration of light is ensured by a lens and other components. Concentration of C included in the saturable absorbing layer 19 is $2 \times 10^{18}/cm^3$.

Figure 2:
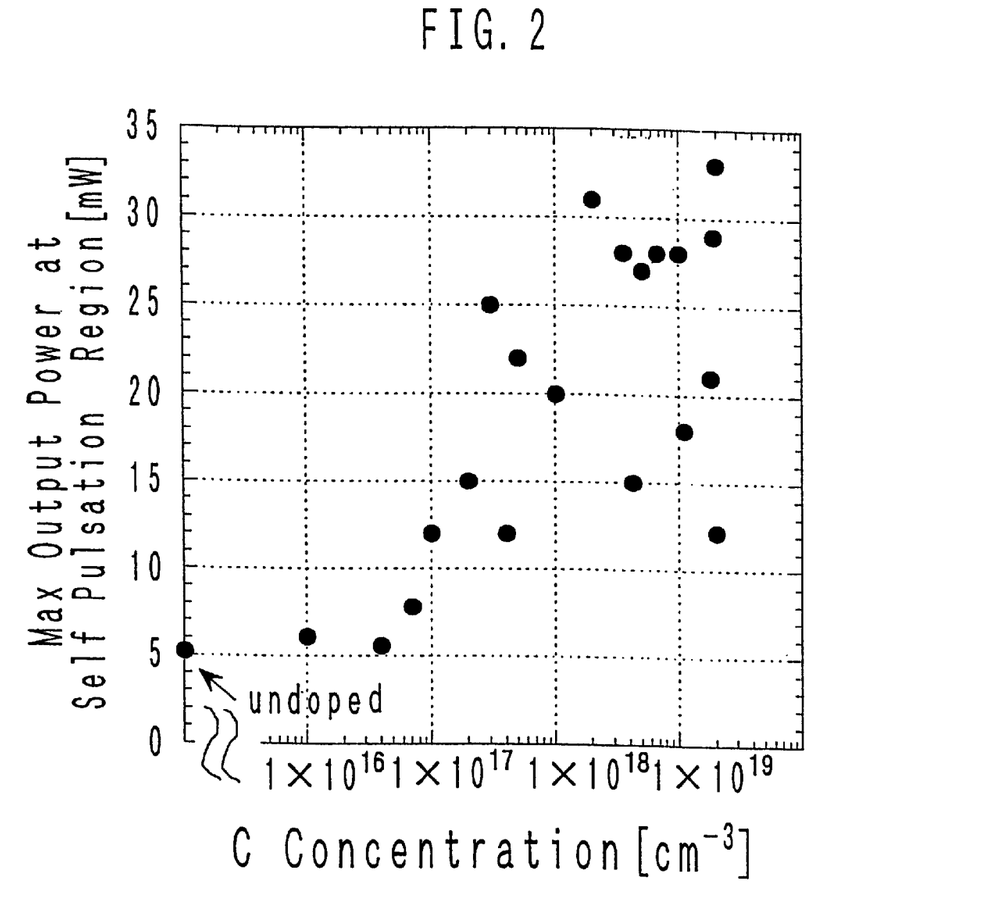
FIG. 2 is a graph showing maximum laser beam output power with respect to C (carbon) concentration in the nitride semiconductor laser according to the first embodiment of the present invention.

FIG. 2 is a graph showing the self-pulsation characteristics examined by varying output power of the nitride semiconductor laser described above. In FIG. 2, the horizontal axis represents concentration of C provided as a dopant to the saturable absorbing layer 19 made of InGaN, and the vertical axis represents maximum laser beam output power at which the nitride semiconductor laser can obtain self-pulsation for each concentration condition. As shown in FIG. 2, as the concentration of C provided as a dopant to the saturable absorbing layer 19 is decreased, a maximum laser beam output power at which self-pulsation can be obtained is also decreased. In view of these results, self-pulsation which maintains a prescribed output power is obtained in the nitride semiconductor laser by doping the saturable absorbing layer 19 with C as a dopant at a concentration of $1 \times 10^{17}/cm^3$ or more, as described in detail below.

Regarding the cases where the growth temperature of the saturable absorbing layer 19 made of InGaN is substantially 650° C. and where it is 750° C., the maximum laser beam output power at which self-pulsation can be obtained is shown in Table 1 below. From Table 1, when the growth temperature of the saturable absorbing layer 19 is 650° C., it is appreciated that self-pulsation is obtained in a range of laser beam output powers from 5 mW to as high as 20 mW, and when the growth temperature of the saturable absorbing layer 19 is 750° C., it is appreciated that the self-pulsation is obtained in a range of laser beam output powers from 5 mW to 10 mW at most. Consequently, it is confirmed that the self-pulsation characteristics of the saturable absorbing layer 19 deteriorates when the growth temperature of the saturable absorbing layer 19 is too high.

TABLE 1

| | Output power | | | | |
|---|---|---|---|---|---|
| | 5 mW | 10 mW | 15 mW | 20 mW | 25 mW |
| G.T. 650° C. | ◯ | ◯ | ◯ | ◯ | ... |
| G.T. 750° C. | ◯ | ... | ... | ... | ... |

(where "G.T." represents growth temperature)

Figure 6:
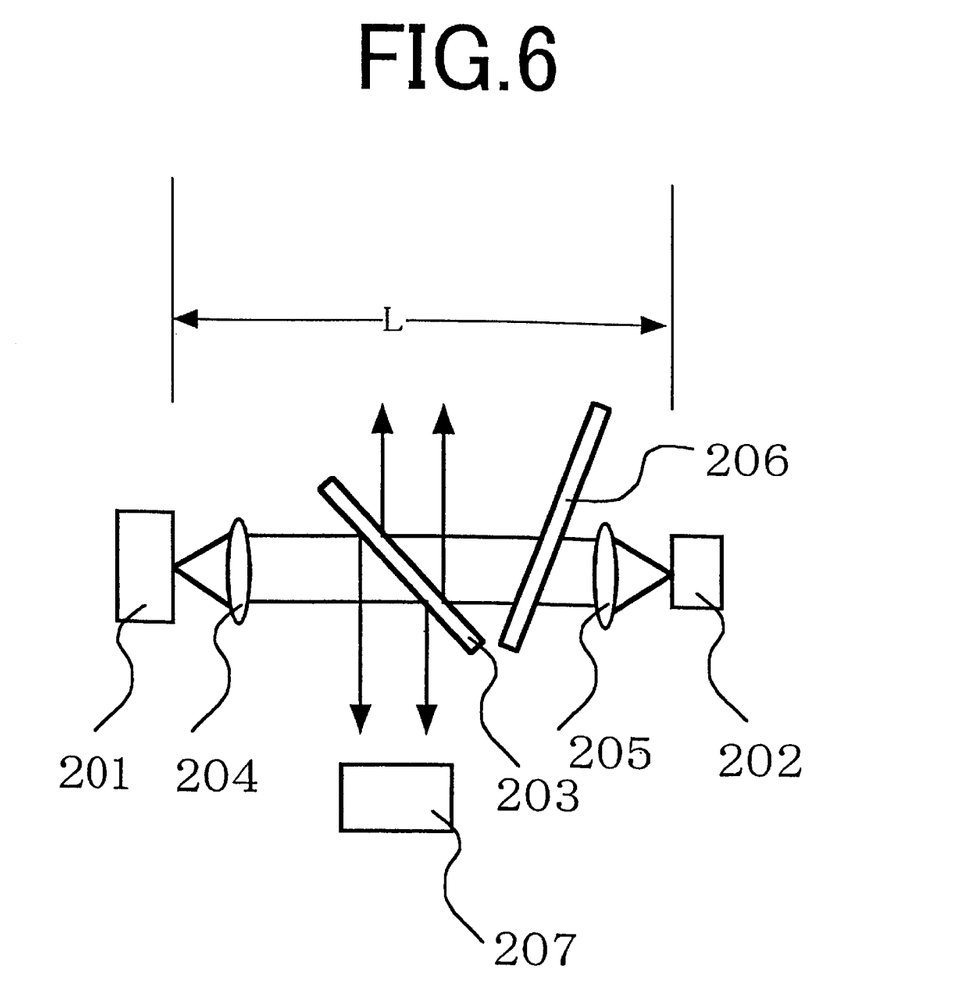
FIG. 6 is a schematic view of an automatic noise measuring device for examining noise characteristics of a nitride semiconductor laser.

Next, noise characteristics of optical feedback is examined as to the case where the nitride semiconductor laser according to the first embodiment of the present invention is used as a light source for optical disks. The noise in optical feedback to the nitride semiconductor laser mounted on an optical disk system is simulatively measured using an automatic noise measuring device illustrated in FIG. 6. In FIG. 6, a laser beam output by a semiconductor laser 201 is collimated by a lens 204, and the collimated beam is branched into two beams by a half mirror 203. The half mirror 203 transmits part of the collimated beam, and the transmitted light is concentrated through an ND (neutral density) filter 206 and a lens 205 onto a reflection mirror 202. The reflection mirror 202 is equivalent to an optical disk or the like, and the reflectance thereof can be changed using the ND filter 206. The transmitted light is reflected by the reflection mirror 202 and returns along the same path, whereby the reflected light is collected by the semiconductor laser 201. The automatic noise measuring device is an optical disk system including a semiconductor laser and measures relative intensity noise (RIN) including the external optical feedback noise. It should be noted that the output power is detected by a light-receiving component 207.

For an output power of 5 mW, the noise in optical feedback is examined when the optical feedback is 0.1% to 10% of an entire output beam. In this case, the examined noise in optical feedback is represented by RINmax<−135 [dB/Hz]. Then, in order to examine noise characteristics of optical feedback when laser beam output power is high, the laser beam output power is increased to about 20 mW. In this case, the examined noise in optical feedback is also represented by RINmax<−135 [dB/Hz]. Thus, the nitride semiconductor laser according to the first embodiment is applicable to an optical disk system.

In the nitride semiconductor laser according to the first embodiment of the present invention, although the saturable absorbing layer 19 made of InGaN is provided between a p-type guide layer and a p-type cladding layer, the saturable absorbing layer 19 may be provided in either the p-type guide layer or the p-type cladding layer. When providing the saturable absorbing layer 19 in either the p-type guide layer or the p-type cladding layer, it is necessary to change the thickness of the saturable absorbing layer 19 in consideration of light distribution. Additionally, the growth temperature of the saturable absorbing layer 19 made of InGaN may be any suitable temperature so long as it is equal to or lower than the growth temperature of the n-type InGaN active layer 16. Furthermore, portions of the nitride semiconductor laser removed for forming the ridge structure may be filled using a different material so as to form a region to bury the ridge structure. Furtherstill, the saturable absorbing layer 19 made of InGaN may be a multiple quantum well layer, and the n-type InGaN active layer 16 may be formed using a material such as GaNAs, GaNP, or InAlGaNAsP.

(Embodiment 2)

Figure 3:
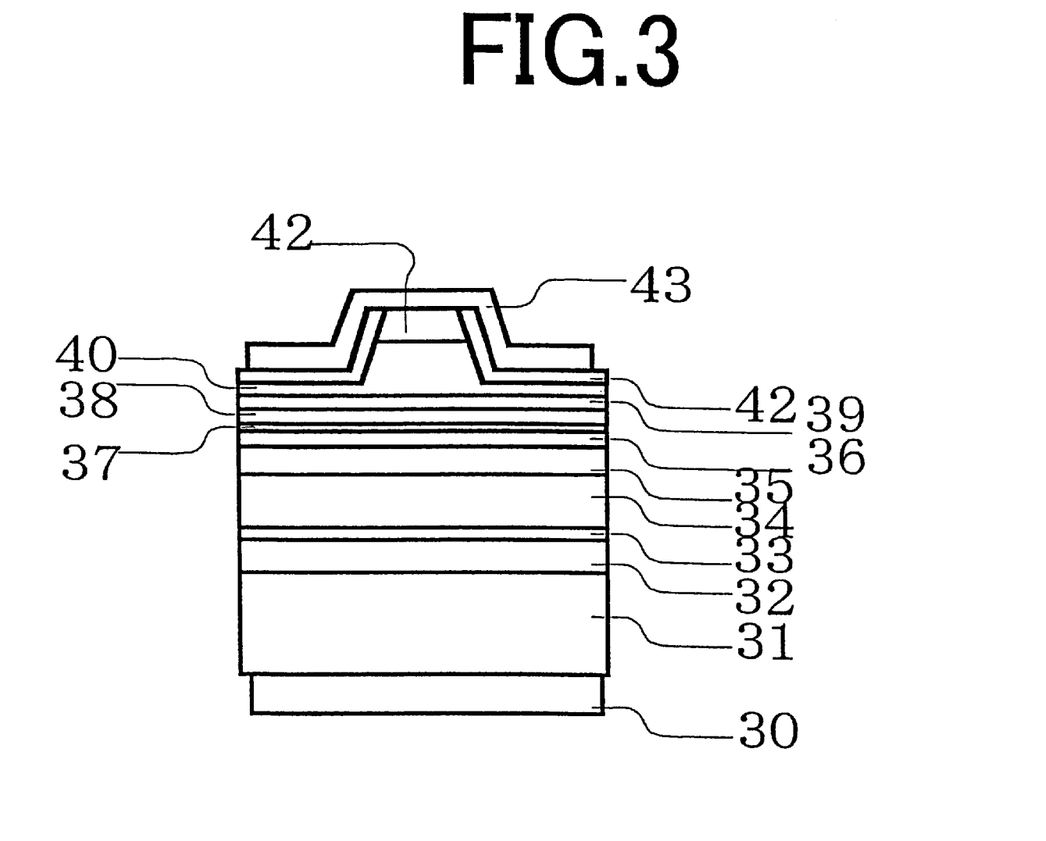
FIG. 3 is a cross-sectional view of a nitride semiconductor laser according to a second embodiment of the present invention.

FIG. 3 is a cross-sectional view of a nitride semiconductor laser according to a second embodiment of the present invention. This nitride semiconductor laser includes an n-type GaN substrate 31 on which an n-type GaN layer 32, an n-type InGaN crack prevention layer 33, an n-type AlGaN cladding layer 34, an n-type GaN guide layer 35, an n-type GaNAs active layer 36, a p-type AlGaN barrier layer 37, a p-type GaN guide layer 38, a saturable absorbing layer 39 made of InGaN, and a p-type AlGaN cladding layer 40 are sequentially laminated. The p-type AlGaN cladding layer 40 has a ridge structure where a central portion of the p-type AlGaN cladding layer 40 along a width direction thereof projects perpendicular to a stripe direction (i.e., a direction perpendicular to the plane of FIG. 3). On the projected portion of the p-type AlGaN cladding layer 40, a p-type GaN contact layer 41 is laminated. An insulating layer 42 is provided on the p-type AlGaN cladding layer 40 and the p-type GaN contact layer 41 except a top surface of the p-type GaN contact layer 41. A p-type electrode 43 is provided on the insulating layer 42 and the top surface of the p-type GaN contact layer 41. An n-type electrode 30 is provided below the n-type GaN substrate 31. It should be noted that the saturable absorbing layer 39 is a single quantum well layer and is doped with Mg together with C (carbon) in a similar manner as in the nitride semiconductor laser according to the first embodiment of the present invention.

The nitride semiconductor laser shown in FIG. 3 includes an index waveguide formed using the same ridge structure as in the nitride semiconductor laser shown in FIG. 1. The nitride semiconductor laser shown in FIG. 1 and the nitride semiconductor laser shown in FIG. 3 have only a slight difference from each other in that the nitride semiconductor laser shown in FIG. 1 includes the n-type InGaN active layer 16 as an active layer and the nitride semiconductor laser shown in FIG. 3 includes the n-type GaNAs active layer 36 as an active layer. That is, only the respective constituent elements are different.

The nitride semiconductor laser shown in FIG. 3 is produced using a similar method for producing the nitride semiconductor laser according to the first embodiment of the present invention. Production conditions of the nitride semiconductor laser according to the second embodiment differs from those of the nitride semiconductor laser according to the first embodiment only in the conditions of forming the saturable absorbing layer 39 made of InGaN. The saturable absorbing layer 39 is formed at a growth temperature of 700° C. using an epitaxial growth method and is doped with C (carbon) and Mg during the formation. Similar to the nitride semiconductor laser according to the first embodiment, acetylene is used as a doping material of C, and Cp$_2$Mg is used as a doping material of Mg. The concentrations of C and Mg are $1\times10^{17}/\text{cm}^3$ or more and $1\times10^{18}/\text{cm}^3$ to $2\times10^{20}/\text{cm}^3$, respectively. The other production conditions are the same as those of the nitride semiconductor laser according to the first embodiment.

Characteristics of the nitride semiconductor laser produced according to the second embodiment of the present invention have been examined by the present inventors. The examination results are described as follows. A resonator length of the nitride semiconductor laser is substantially 500

μm, and a stripe width thereof is substantially 2 μm. When the temperature is 25° C., this nitride semiconductor laser continuously oscillates at a threshold current of 36 mA, which is a starting point of the laser oscillation. In this case, a wavelength is 405±5 nm. From observation of a far field pattern, it is appreciated that there are no ripples in the far field pattern, and concentration of light is ensured by a lens and other components. Concentrations of C and Mg included in the saturable absorbing layer 39 are respectively $2\times10^{18}/cm^3$ and $1\times10^{19}/cm^3$.

From the examination of self-pulsation characteristics conducted by varying the laser beam output power of the nitride semiconductor laser according to the second embodiment, as in the case of the nitride semiconductor laser according to the first embodiment, it is appreciated that as the concentration of C provided as a dopant to the saturable absorbing layer 39 is decreased, a maximum laser beam output power at which self-pulsation can be obtained is also decreased. In view of these results, self-pulsation which maintains a prescribed output power is obtained in the nitride semiconductor laser by doping the saturable absorbing layer 39 with C at concentration of $1\times10^{17}/cm^3$ or more and Mg at concentration of $1\times10^{18}/cm^3$ or more.

Next, as in the case of the nitride semiconductor laser according to the first embodiment, noise characteristics of optical feedback are examined for the case where the nitride semiconductor laser according to the second embodiment is used as a light source for optical disks. The noise in optical feedback to the nitride semiconductor laser mounted on an optical disk system is simulatively measured using the automatic noise measuring device illustrated in FIG. 6. Firstly, for an output power of 5 mW, noise in optical feedback is examined using the automatic noise measuring device shown in FIG. 6 when the optical feedback is 0.1% to 10% of an entire output beam. In this case, the examined noise in optical feedback is represented by RINmax<−137 [dB/Hz]. Then, in order to examine noise characteristics of optical feedback when laser beam output power is high, the laser beam output power is increased to about 20 mW. In this case, the examined noise in optical feedback is also represented by RINmax<−137 [dB/Hz]. Thus, the nitride semiconductor laser according to the second embodiment is applicable to an optical disk system.

In the nitride semiconductor laser according to the second embodiment of the present invention, although the saturable absorbing layer 39 made of InGaN is provided between a p-type guide layer and a p-type cladding layer, the saturable absorbing layer 39 may be provided in either the p-type guide layer or the p-type cladding layer. When providing the saturable absorbing layer 39 in either the p-type guide layer or the p-type cladding layer, it is necessary to change the thickness of the saturable absorbing layer 39 in consideration of light distribution. Additionally, the growth temperature of the saturable absorbing layer 39 made of InGaN is not limited to the growth temperature described above. Furthermore, portions of the nitride semiconductor laser removed for forming the ridge structure may be filled using a different material so as to form a region to bury the ridge structure. Furtherstill, the saturable absorbing layer 39 made of InGaN may be a multiple quantum well layer, and the n-type GaNAs active layer 36 may be formed using a material such as InGaN, GaNP, or InAlGaNAsP.

(Embodiment 3)

Figure 4:
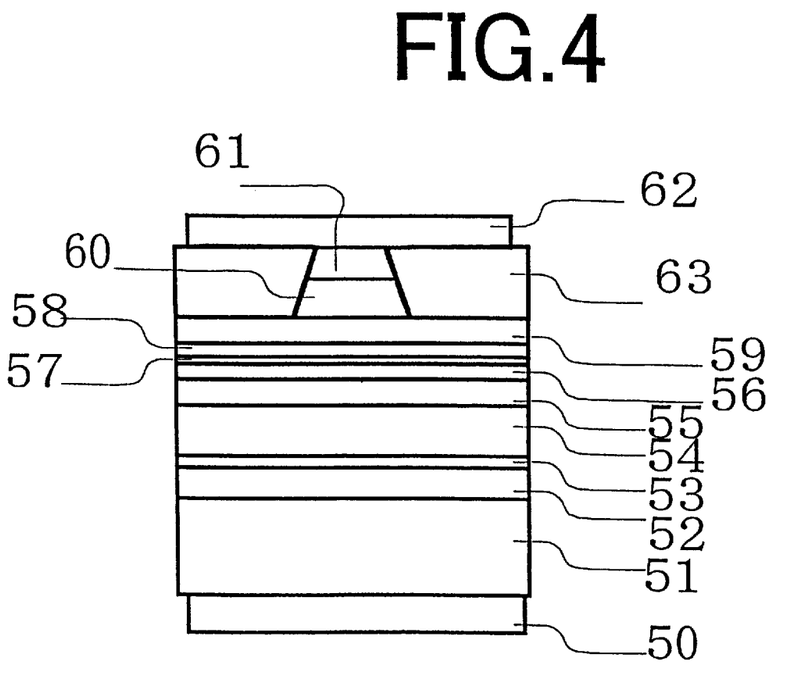
FIG. 4 is a cross-sectional view of a nitride semiconductor laser according to a third embodiment of the present invention.

FIG. 4 is a cross-sectional view of a nitride semiconductor laser according to a third embodiment of the present invention. The nitride semiconductor laser according to the third embodiment employs a buried ridge structure. This nitride semiconductor laser includes an n-type GaN substrate 51 on which an n-type GaN layer 52, an n-type InGaN crack prevention layer 53, an n-type AlGaN cladding layer 54, an n-type GaN guide layer 55, an n-type InGaN active layer 56, a p-type AlGaN barrier layer 57, a p-type GaN guide layer 58, a saturable absorbing layer 59 made of InGaN and GaN, and a p-type AlGaN cladding layer 60 are sequentially laminated.

Figure 5:
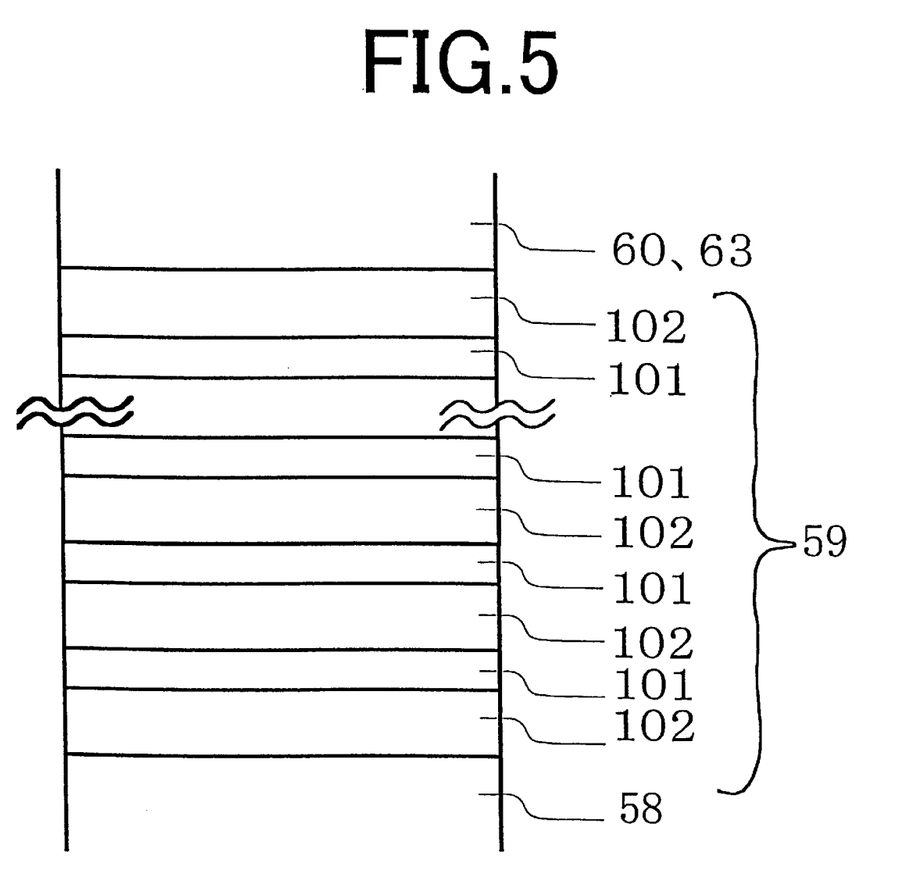
FIG. 5 is a detailed cross-sectional view of a saturable absorbing layer of FIG. 4.

The p-type AlGaN cladding layer 60 has a ridge structure where a central portion of the p-type AlGaN cladding layer 60 along a width direction thereof projects perpendicular to a stripe direction (i.e., a direction perpendicular to the plane of FIG. 4). On the projected portion of the p-type AlGaN cladding layer 60, a p-type GaN contact layer 61 is laminated. An n-type blocking layer 63 is provided around the p-type AlGaN cladding layer 60 and the p-type GaN contact layer 61 so as to bury these layers with a top surface of the p-type GaN contact layer 61 being exposed. A p-type electrode 62 is provided on the n-type blocking layer 63 and the top surface of the p-type GaN contact layer 61. An n-type electrode 50 is provided below the n-type GaN substrate 51. As shown in FIG. 5, the saturable absorbing layer 59 made of InGaN and GaN has a multiple quantum well structure in which quantum well layers 101 made of InGaN and barrier layers 102 made of GaN are alternately laminated. The InGaN quantum well layer 101 is doped with C (carbon), but the barrier layer 102 is not doped with C.

In the structure of the nitride semiconductor laser, shown in FIG. 4, according to the third embodiment, carriers generated in the saturable absorbing layer 59 by light absorption are diffused through a light absorption region outwardly in the saturable absorbing layer 59, and thereafter the diffused carriers are recombined in each of the quantum well layers 101 and the barrier layers 102 while some of the carriers are diffused into the n-type blocking layer 63, thereby shortening the apparent carrier lifetime in the light absorption region. In order to shorten the apparent lifetime of the carrier by diffusing the carrier into the n-type blocking layer 63 which is doped with a dopant of high concentration, it is essential for the saturable absorbing layer 59 to have a sufficiently large diffusion coefficient to facilitate the carrier diffusion. In the nitride semiconductor laser according to the third embodiment, by forming the saturable absorbing layer 59 made of InGaN and GaN so as to have a multiple quantum well structure, it is possible to increase the diffusion coefficient of the saturable absorbing layer 59.

The nitride semiconductor laser according to the third embodiment has the buried ridge structure in which the p-type AlGaN cladding layer 60 and the p-type GaN contact layer 61 are buried in the n-type blocking layer 63, and thus the nitride semiconductor laser according to the third embodiment is not provided with an insulating layer such as the insulating layer 22 provided in the nitride semiconductor laser according to the first embodiment, as shown in FIG. 1. However, the nitride semiconductor laser according to the third embodiment is produced using almost the same method as that used for producing the nitride semiconductor laser according to the first embodiment. Accordingly, the nitride semiconductor laser according to the third embodiment is produced under the same conditions as those of the nitride semiconductor laser according to the first embodiment until the p-type GaN guide layer 58 is laminated on the p-type AlGaN barrier layer 57.

After the lamination of the the p-type GaN guide layer 58 onto the p-type AlGaN barrier layer 57, the growth temperature is decreased to substantially 950° C., and the barrier layer 102 made of GaN, which is a part of the saturable absorbing layer 59 made of InGaN and GaN, is grown on the p-type GaN guide layer 58. Then, the growing temperature is further decreased to substantially 680° C., and the quantum well layer 101 is grown on the GaN barrier 102. In this case, the InGaN quantum well layer 101 is doped with C at a concentration of $1\times10^{17}/cm^3$ or more. In this manner, the lamination of the barrier layers 102 and the quantum well layers 101 are repeated so as to form the saturable absorbing layer 59 in which three quantum well layers 101 and four barrier layers 102 are alternately laminated in a cycle. The quantum well layer 101 made of InGaN has a thickness of substantially 2 nm, and the barrier layer 102 has a thickness of substantially 4 nm. It should be noted that with the results of the study on the respective thicknesses of the quantum well layer 101 and the barrier layer 102, the quantum well layer 101 may have a thickness of between about 1 nm and 10 nm, which allows quantum effects to be obtained, and the barrier layer 102 may have a thickness of between about 1 nm and 10 nm. A multiple quantum well layer including at least one quantum well layers 101 may include three to six layers.

Based on PL measurements of a wafer of the nitride semiconductor laser, a difference in a PL peak wavelength between light emitted by the n-type InGaN active layer 56 and light emitted by the saturable absorbing layer 59 is set so as to be within a range of between about −0.15 eV and 0.02 eV, so that actual bandgaps of the n-type InGaN active layer 56 and the saturable absorbing layer 59 are adjusted so as to be almost equivalent to each other. It should be noted that the barrier layer 102 may be made of InGaN.

Next, as in the case of the nitride semiconductor laser according to the first embodiment, the p-type AlGaN cladding layer 60 and the p-type GaN contact layer 61 are formed on the saturable absorbing layer 59 made of InGaN and GaN. After the formation of the p-type contact layer 61, the p-type AlGaN cladding layer 60 and the p-type GaN contact layer 61 are removed by dry etching such that their central portions along the width direction are left unremoved so as to form a ridge structure. Thereafter, the n-type blocking layer 63 is formed on the saturable absorbing layer 59 using an epitaxial growth method so as to bury this ridge structure portion. The n-type blocking layer 63 is doped with Si at a concentration of $1\times10^{18}/cm^3$ or more. Production conditions for subsequent steps are the same as those for corresponding steps used for producing the nitride semiconductor laser according to the first embodiment.

Characteristics of the nitride semiconductor laser produced in the above-described manner have been examined by the present inventors. The examination results are described as follows. A resonator length of the nitride semiconductor laser is substantially 400 μm, and a stripe width thereof is substantially 3 μm. When the temperature is 25° C., this nitride semiconductor laser continuously oscillates at a threshold current of 38 mA, which is a starting point of the laser oscillation. In this case, a wavelength is 405±5 nm. From observation of a far field pattern, it is appreciated that there are no ripples in the far field pattern, and concentration of light is ensured by a lens and other components. The concentration of C included in the quantum well layer 101 in the saturable absorbing layer 59 is $2\times10^{18}/cm^3$. On the other hand, C is not detected in the barrier layer 102 in the saturable absorbing layer 59.

From the examination of the self-pulsation characteristics conducted by varying the output power of the nitride semiconductor laser according to the third embodiment, as in the case of the nitride semiconductor laser according to the first embodiment, it is appreciated that a maximum laser beam output power at which self-pulsation can be obtained is 35 mW, which is high as compared to the case of the nitride semiconductor laser according to the first embodiment.

Next, as in the case of the nitride semiconductor laser according to the first embodiment, noise characteristics of optical feedback are examined for the case where the nitride semiconductor laser according to the third embodiment is used as a light source for optical disks. The noise in optical feedback to the nitride semiconductor laser mounted on an optical disk system is simulatively measured using an automatic noise measuring device illustrated in FIG. 6. Firstly, for an output power of 5 mW, noise in optical feedback is examined using the automatic noise measuring device shown in FIG. 6 when the optical feedback is 0.1% to 10% of an entire output beam. In this case, the examined noise in optical feedback is represented by RINmax<−137 [dB/Hz]. Then, in order to examine noise characteristics of optical feedback when laser beam output power is high, the laser beam output power is increased to about 30 mW. In this case, the examined noise in optical feedback is also represented by RINmax<−142 [dB/Hz]. Thus, the nitride semiconductor laser according to the third embodiment is applicable to an optical disk system for recording, reproduction, etc.

From the results of the study on concentration of C provided as a dopant in the quantum well layer 101 made of InGaN in the saturable absorbing layer 59 made of InGaN and GaN, it is appreciated that the required concentration of C is $1\times10^{17}/cm^3$ or more, and under this condition, each of the quantum well layer 101 and the barrier layer 102 can be doped with Mg. In this manner, a nitride semiconductor laser, which can obtain self-pulsation in a range from a low output level to a high output level, has been realized.

In the nitride semiconductor laser according to the third embodiment of the present invention, although the saturable absorbing layer 59 made of InGaN and GaN is provided between a p-type guide layer and a p-type cladding layer, the saturable absorbing layer 59 may be provided in either the p-type guide or the p-type cladding layer. When providing the saturable absorbing layer 59 in either the p-type guide or the p-type cladding layer, the recombination of the carrier generated by light absorption is delayed since the saturable absorbing layer 59 and the n-type blocking layer 63 are out of contact with each other, so that an output power range in which self-pulsation can be obtained is made to be narrow. However, the output power range in which self-pulsation can be obtained is still equal to or more than that in the case of the nitride semiconductor laser according to the first embodiment. In this case, it is necessary to change the number of layers provided as the quantum well layers 101 to be formed in the saturable absorbing layer 59 in consideration of light distribution.

A semiconductor light-emitting device according to the present invention includes a substrate, a light-emitting layer, and a saturable absorbing layer. The light-emitting layer and the saturable absorbing layer are provided above the substrate. The saturable absorbing layer has characteristics in which saturation of light absorption occurs. By doping the saturable absorbing layer with C, it is possible to shorten a lifetime of a carrier generated by light absorption in the saturable absorbing layer, thereby stable self-pulsation characteristics can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light-emitting device, comprising:

a substrate;

a nitride semiconductor light-emitting layer provided above the substrate; and a nitride semiconductor saturable absorbing layer provided above the substrate, the saturable absorbing layer having characteristics in which saturation of light absorption occurs, wherein:

the semiconductor light-emitting device has self-pulsation characteristics due to the saturable absorbing layer; and the semiconductor light-emitting device is characterized in that the saturable absorbing layer is doped with carbon.

2. A semiconductor light-emitting device according to claim 1, wherein the saturable absorbing layer is doped with a p-type dopant.

3. A semiconductor light-emitting device according to claim 1, wherein the saturable absorbing layer includes a quantum well layer.

4. A semiconductor light-emitting device according to claim 1, wherein the saturable absorbing layer has a multiple quantum well structure including a plurality of quantum well layers and a plurality of barrier layers.

5. A semiconductor light-emitting device according to claim 4, wherein the plurality of quantum well layers are doped with carbon and the plurality of barrier layers are not doped with carbon.

6. A semiconductor light-emitting device according to claim 1, wherein the saturable absorbing layer is further doped with magnesium.

7. A semiconductor light-emitting device according to claim 1, wherein the nitride semiconductor saturable absorbing layer is an InGaN saturable absorbing layer.

* * * * *